US008699284B2

(12) United States Patent
Takahashi et al.

(10) Patent No.: US 8,699,284 B2
(45) Date of Patent: *Apr. 15, 2014

(54) SEMICONDUCTOR INTEGRATED CIRCUIT WITH THICK GATE OXIDE WORD LINE DRIVING CIRCUIT (71) Applicant: Renesas Electronics Corporation, Kanagawa (JP)

(72) Inventors: Hiroyuki Takahashi, Kanagawa (JP); Hidetaka Natsume, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/752,862

(22) Filed: Jan. 29, 2013

(65) Prior Publication Data
US 2013/0141999 A1 Jun. 6, 2013

Related U.S. Application Data (63) Continuation of application No. 13/210,949, filed on Aug. 16, 2011, now Pat. No. 8,391,084, which is a continuation of application No. 12/256,653, filed on Oct. 23, 2008, now Pat. No. 8,036,048.

(30) Foreign Application Priority Data

Nov. 12, 2007 (JP) .................. 2007-292878

(51) Int. Cl.
*G11C 7/00* (2006.01)
*G11C 8/08* (2006.01)

(52) U.S. Cl.
CPC ...................... *G11C 8/08* (2013.01)
USPC ............. 365/189.11; 365/149; 365/189.09; 365/230.06

(58) Field of Classification Search
USPC ................. 365/189.09, 189.11, 230.06
See application file for complete search history.

(56) References Cited

U.S. PATENT DOCUMENTS 5,424,990 A 6/1995 Ohsawa
5,448,526 A 9/1995 Horiguchi et al.
(Continued)

FOREIGN PATENT DOCUMENTS

| JP | 61-283162 | 12/1986 |
|---|---|---|
| JP | 4-298886 | 10/1992 |
| JP | 7-57461 | 3/1995 |
| JP | 11-150242 | 6/1999 |
| JP | 11-283369 | 10/1999 |
| JP | 2001-015704 | 1/2001 |
| JP | 2003-100076 | 4/2003 |
| JP | 2004-213722 | 7/2004 |
| JP | 2007-292878 | 11/2007 |

OTHER PUBLICATIONS

Double Data Rate (DDR) SDRAM Specification, Mar. 2003, JEDEC Solid State Tech. Ass'n., JESD79C, p. 1, See U.S. Appl. No. 13/210,949.
Notice of Reasons for Rejection mailed Apr. 17, 2012 by the Japanese Patent Office in counterpart Japanese Patent Application No. 2007-292878, with translation, 7 pages, See U.S. Appl. No. 13/210,949.
Japanese Official Action—2007-292878—Dec. 18, 2012, See U.S. Appl. No. 13/210,949.

*Primary Examiner* — Harry W Byrne
*Assistant Examiner* — Lance Reidlinger
(74) *Attorney, Agent, or Firm* — Young & Thompson (57) ABSTRACT

A semiconductor integrated circuit according to one aspect of the present invention may includes a plurality of driving circuits to drive a respective plurality of word lines with either a first voltage supplied from a first power supply or a second voltage supplied from a second power supply in accordance with a control signal, and a plurality of gate transistors in each of which a gate is connected to one of the plurality of word lines, and a connection state between a storage node and a bit line is changed based on the voltage provided to the word line connected to the gate. In the semiconductor integrated circuit, a gate oxide film of each of the plurality of gate transistors is thinner than a gate oxide film of each of transistors constituting the plurality of driving circuits.

9 Claims, 7 Drawing Sheets

(56) References Cited

U.S. PATENT DOCUMENTS

| | | |
|---|---|---|
| 5,600,598 A | 2/1997 | Skjaveland et al. |
| 5,654,917 A | 8/1997 | Ogura et al. |
| 6,117,725 A | 9/2000 | Huang |
| 6,215,708 B1 | 4/2001 | Lien et al. |
| 6,768,689 B2 | 7/2004 | Origasa |
| 6,836,421 B2 | 12/2004 | Rinerson et al. |
| 7,035,128 B2 | 4/2006 | Yamasaki et al. |
| 7,408,813 B2 | 8/2008 | Lovett |
| 7,733,735 B2 | 6/2010 | Origasa |
| 2004/0136219 A1 | 7/2004 | Yamasaki et al. |

| BLOCK NAME | CELL ARRAY | I/O CIRCUIT | STEP-DOWN CIRCUIT | CONTROL CIRCUIT | CPU | WORD LINE DRIVING CIRCUIT | STEP-UP CIRCUIT |
|---|---|---|---|---|---|---|---|
| APPLIED POWER SUPPLY | STEP-UP VOLTAGE VPP (INTERMITTENT) | EXTERNAL POWER SUPPLY VOLTAGE EVDD | EXTERNAL POWER SUPPLY VOLTAGE EVDD STEP DOWN VOLTAGE VDDi | STEP DOWN VOLTAGE VDDi | STEP DOWN VOLTAGE VDDi | STEP-UP VOLTAGE VPP | EXTERNAL POWER SUPPLY VOLTAGE EVDD STEP-UP VOLTAGE VPP |
| MAXIMUM APPLIED VOLTAGE | 2.5V | 1.8V | 1.8V and 1.0V | 1.0V | 1.0V | 2.5V | 1.8V and 2.5V |
| FILM THICKNESS | INTERMEDIATE | INTERMEDIATE | THINNER | THINNER | THINNER | THICKER | THICKER |

SEMICONDUCTOR INTEGRATED CIRCUIT WITH THICK GATE OXIDE WORD LINE DRIVING CIRCUIT

BACKGROUND OF THE INVENTION

1. Field of the Invention

The present invention relates to semiconductor integrated circuits and, more specifically, to a semiconductor integrated circuit provided with memory cells of a DRAM.

2. Description of Related Art

A DRAM (Dynamic Random Access Memory) has recently become popular for use as a storage device in a semiconductor integrated circuit. In the DRAM, data is recorded in storage nodes by storing electrical charge in a capacitor in each of the memory cells, and data is exchanged between bit lines and the storage nodes via a gate transistor. For performing data exchange as such without fail even if the data stored in the storage nodes has a voltage almost the same as a power supply voltage VDD in the DRAM, a step-up voltage VPP higher than the power supply voltage VDD is applied to the gate in order to bring the gate transistor to a selected state.

For such an operation, the gate transistor of the DRAM is required to have voltage resistance of a level enough to withstand an application of the step-up voltage VPP. With a MOS (Metal Oxide Semiconductor) transistor, the voltage resistance can be increased with a thicker gate oxide film. When the transistor does not have the voltage resistance high enough for an applied voltage, the element suffers age deterioration faster than usual, or element is damaged. In consideration thereof, the gate oxide film of the gate transistor generally has the same thickness as that of a transistor of a driving circuit supplying the step-up voltage VPP to the gate of the gate transistor.

On the other hand, a power supply voltage VDD is applied to the transistor constituting a control circuit, and such a transistor is not thus required to have the voltage resistance as high as the transistor of the driving circuit and the gate transistor. Accordingly, any transistor constituting a circuit operating with the power supply voltage VDD, e.g., control circuit, can have a gate oxide film thinner than those of the transistor of the driving circuit and the gate transistor. With a thinner gate oxide film as such, the circuit operation can become faster, and the transistor can be more miniaturized.

As such, with a semiconductor integrated circuit, the thickness of the gate oxide film (or the level of the voltage resistance) of the transistor is changed in accordance with an applied voltage, thereby being able to reduce the circuit size while assuring the level of the voltage resistance of the transistor. Japanese Unexamined Patent Application Publication No. 2001-15704 describes such a previous technology of using a plurality of transistors having different thickness in accordance with an applied voltage.

The present inventors have found a problem as follows. The transistor has two different types of voltage resistance, one is not to immediately damage elements after voltage application, and the other is not to cause age deterioration to elements due to continuous voltage application. As such, as for transistors to which a high voltage is applied, when any transistor for use in a portion to be subjected to short-term application of high voltage is so designed as to be resistant to continuous application of high voltage, the resulting transistor shows considerably small performance deterioration in view of the product life. With such a voltage-resistant design, however, the gate oxide film in the transistor will be excessively increased in thickness, thereby causing a problem of increasing the circuit size due to the increase in element size.

SUMMARY

A semiconductor integrated circuit according to one aspect of the present invention may includes a plurality of driving circuits to drive a respective plurality of word lines with either a first voltage supplied from a first power supply or a second voltage supplied from a second power supply in accordance with a control signal, a plurality of gate transistors in each of which a gate is connected to one of the plurality of word lines, and a connection state between a storage node and a bit line is changed based on the voltage provided to the word line connected to the gate, and a control circuit to control data writing or reading to or from the storage node via one of the plurality of the gate transistors. In the semiconductor integrated circuit, a gate oxide film of each of the plurality of gate transistors is thinner than agate oxide film of each of transistors constituting the plurality of driving circuits.

A semiconductor integrated circuit according to another aspect of the present invention may includes a DRAM cell, a word line connected to a gate of a gate transistor included in the DRAM cell, and a driving circuit to drive the word line. In the semiconductor integrated circuit, the transistor in the driving circuit has a gate oxide film thicker than a gate oxide film of the gate transistor.

In a semiconductor integrated circuit of the invention, a gate transistor whose gate is not subjected to stationary application of either a first or second voltage is provided with a gate oxide film thinner than that of a transistor of a driving circuit. This favorably reduces the circuit size in the semiconductor integrated circuit without excessively increasing the element size of the gate transistor.

The semiconductor integrated circuit of the invention can increase the efficiency in terms of circuit size.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

First Embodiment

Figure 1:
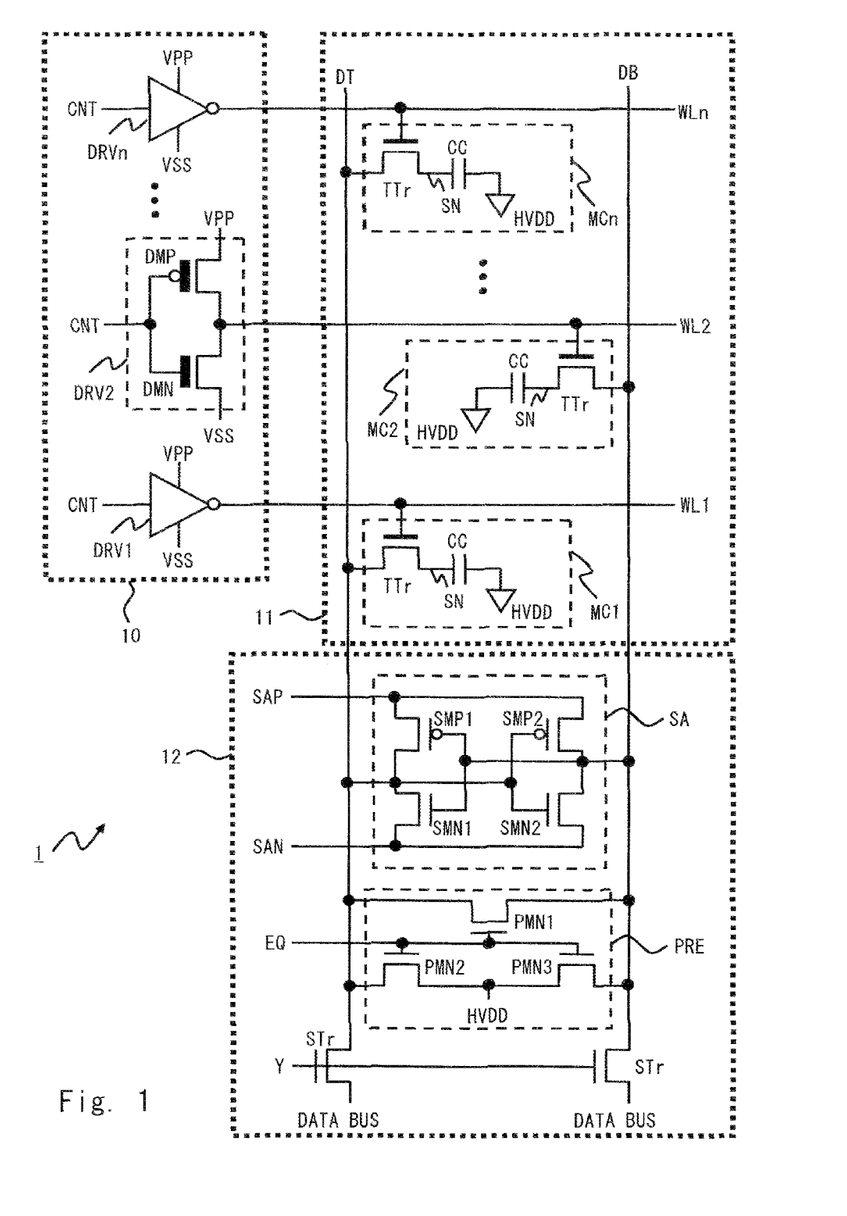
FIG. 1 is a block diagram showing a semiconductor integrated circuit according to a first embodiment of the present invention.

In the below, described are embodiments of the invention with reference to the accompanying drawings. A semiconductor integrated circuit of a first embodiment includes a DRAM. FIG. 1 shows a block diagram of such a semiconductor integrated circuit 1 of the first embodiment. FIG. 1 shows only a portion related to the DRAM in the semiconductor integrated circuit 1. The DRAM generally includes a plurality of bit-line pairs each of which is comprised of bit lines DT and DB, but for simplicity, FIG. 1 shows only one bit-line pair.

As shown in FIG. 1, the semiconductor integrated circuit 1 is configured to include a word-line driving circuit 10, a cell array 11, and a control circuit 12. The word-line driving circuit 10 includes a plurality of driving circuits DRV1 to DRVn (hereinafter, collectively referred to as driving circuits DRV). Note that, in the below, n is an integer and indicates a component number. The driving circuits DRV1 to DRVn are respectively connected with, at their output terminals, word lines WL1 to WLn (hereinafter, collectively referred to as word lines WL). The driving circuits DRV1 to DRVn respectively drive the word lines WL1 to WLn with either a first or second voltage based on a control signal CNT. The first voltage is the one supplied from a first power supply, e.g., step-up voltage VPP, and the second voltage is the one supplied from a second power supply, e.g., ground voltage VSS. The step-up voltage VPP is a voltage obtained by boosting a power supply voltage VDD with a step-up circuit that is not shown, and is higher than the power supply voltage VDD. The control signal CNT is provided from a word-line control circuit that is not shown. The semiconductor integrated circuit 1 of FIG. 1 presumably includes several hundred or more of the driving circuits and several hundred or more of the word lines.

The driving circuits DRV1 to DRVn are of the same configuration, and thus the driving circuit DRV2 is taken as an example for describing the configuration. The driving circuit DRV2 includes a PMOS (P-channel Metal-Oxide Semiconductor) transistor DMP and an NMOS (N-channel Metal-Oxide Semiconductor) transistor DMN, which are connected in series between the first and second power supplies. The gate of the PMOS transistor DMP is connected to the gate of the NMOS transistor DMN, and the control signal CNT is input thereto. The drain of the PMOS transistor DMP is also connected to the drain of the NMOS transistor DMN, and their connection point serves as an output terminal of the driving circuit DRV2. The PMOS transistor DMP and the NMOS transistor DMN each have a gate oxide film having a sufficient thickness to withstand a voltage difference between the step-up voltage VPP and the ground voltage VSS. Herein, the driving circuits DRV do not each necessarily include the inverter-connected PMOS and NMOS transistors, and alternatively, may include transistors of the same conductivity type, e.g., two NMOS transistors, connected in series between the first and second power supplies, for example.

The cell array 11 includes memory cells MC1 to MCn (hereinafter, collectively referred to as memory cells MC). The memory cells MC are provided as many as the word lines. The odd-numbered memory cells, when counted from the side of the control circuit, are connected to their respective bit lines DT, and the even-numbered memory cells are connected to their respective the bit lines DB. The memory cells are of the same configuration, and thus the memory cell MC2 is taken as an example for describing the configuration.

The memory cell MC2 is the one provided corresponding to the word line WL2. The memory cell MC2 includes a gate transistor TTr, and a capacitor CC. In this embodiment, an NMOS transistor is used as an example of the gate transistor TTr. The gate transistor TTr is thus put in a selected state when a step-up voltage VPP is applied to a gate thereof, and when a ground voltage VSS is applied to the gate thereof, the gate transistor TTr is put in a not-selected state. In this embodiment, the gate oxide film of the gate transistor TTr is set thinner than those of the transistors constituting the driving circuits DRV. The gate of the gate transistor TTr is connected to the word line WL2. The drain of the gate transistor TTr is connected to the bit line DB, and the source thereof is connected to one end of the capacitor CC. The capacitor CC and the source of the gate transistor TTr are also connected to each other, and their connection point serves as a storage node SN. The capacitor CC is provided with, at its other end, a bias voltage HVDD. The bias voltage HVDD is half the value of the power supply voltage VDD, for example.

The control circuit 12 controls data writing or reading to or from the storage nodes SN via the gate transistors TTr of the cell array 11. The control circuit 12 is configured to include a sense amplifier SA, a precharge circuit PRE, and two switch transistors STr. The sense amplifier SA and the precharge circuit PRE are connected between the bit lines DT and DB. In each of the switch transistors STr, the gate is provided with a switch control signal Y, and the drain is connected to a data bus. In one of the switch transistors STr, the source is connected to an end of the bit line DT, and in the remaining switch transistor STr, the source is connected to an end of the bit line DB. In this configuration, any voltage to be applied to the circuit formed in the control circuit 12 does not exceed the power supply voltage VDD. Therefore, the gate oxide film of the transistor constituting the control circuit 12 may be thinner than that of the transistor constituting the word-line driving circuit 10 and that of the transistor constituting the cell array 11.

The sense amplifier SA amplifies a very small voltage difference generated between the bit lines DT and DB. The sense amplifier SA includes PMOS transistors SMP1 and SMP2, and NMOS transistors SMN1 and SMN2. The PMOS transistor SMP1 and the NMOS transistor SMN1 are connected in series between a power supply line SAP and a ground line SAN. The power supply line SAP supplies the power supply voltage VDD, and the ground line SAN supplies the ground voltage VSS. The gate of the PMOS transistor SMP1 and the gate of the NMOS transistor SMN1 are connected together, and that connection point is connected to the connection point of the drains of the PMOS transistor SMP2 and the NMOS transistor SMN2 and to the bit line BD. The PMOS transistor SMP2 and the NMOS transistor SMN2 are connected in series between the power supply line SAP and the ground line SAN. The gate of the PMOS transistor SMP2 and the gate of the NMOS transistor SMN2 are connected together, and that connection point is connected to a connection point of the drains of the PMOS transistor SMP1 and the NMOS transistor SMN1 and to the bit line DT.

The precharge circuit PRE precharges the pair of bit lines DT and DB in such a manner that the bit lines DT and DB have a precharge voltage, i.e., in this example, bias voltage HVDD. This precharge is performed before the operation of data writing or reading in accordance with a precharge control signal EQ. The precharge circuit PRE includes NMOS transistors PMN1 to PMN3. As for the NMOS transistor PMN1, the source and drain are connected between the bit lines DT and DB, and the gate is provided with the precharge control signal EQ. The NMOS transistors PMN2 and PMN3 are connected in series between the bit lines DT and DB, and the gate is provided with the precharge control signal EQ. To the connection point between the NMOS transistors PMN2 and PMN3, the bias voltage HVDD is supplied.

Described now in detail is the thickness setting for the gate oxide film of the gate transistor TTr in this embodiment. Described first is the voltage resistance of the MOS transistor. The MOS transistor has two different types of voltage resistance, one is not to cause age deterioration to elements due to continuous voltage application, and the other is not to immediately damage elements after voltage application. The age deterioration of the MOS transistor includes deterioration of its current drive capability ION, for example. Such voltage resistance is determined by the thickness of the gate oxide film of the MOS transistor. In view of the relationship between the applied voltage and the voltage resistance, the voltage applied to the gate oxide film and the length of application time thereof determine whether or not the elements are to be damaged or deteriorated over time. The gate oxide film is under the highest stress when the MOS transistor is in a conducting state conduction. That is, the gate oxide film is put under the higher stress with increasing voltage difference between the well voltage of the MOS transistor and the voltage applied to the gate of the MOS transistor.

In this embodiment, the step-up voltage VPP is continuously applied to the transistors constituting the driving circuit DRV. The step-up voltage VPP is continuously applied to the gate transistor TTr, but this application is limited to a period of time during which one of the memory cells MC is being selected. In this embodiment, because a pair of bit lines is connected with a plurality of memory cells MC, the period of time when any one specific memory cell MC is being selected is extremely short with respect to the use hours of the product. As such, to which the step-up voltage VPP is applied, the gate transistor TTr shows the lower rate of age deterioration even with a thinner gate oxide film, compared with the transistors constituting the driving circuits DRV.

Figure 2:
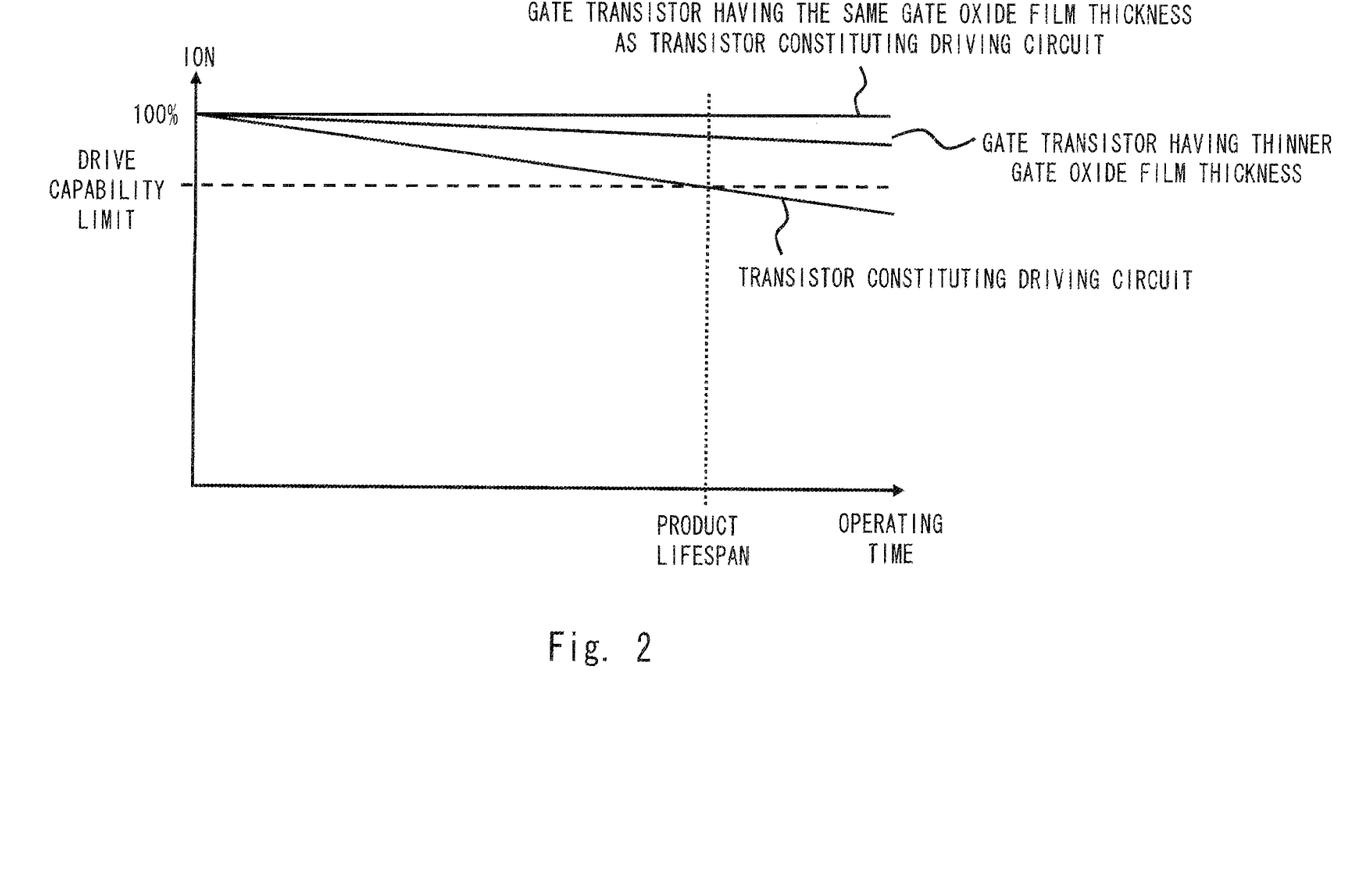
FIG. 2 is a graph showing the relationship between the use hours of the semiconductor integrated circuit and the rate of deterioration of elements.

FIG. 2 shows a graph showing the relationship between the use hours of the semiconductor integrated circuit and the rate of deterioration of elements. The life of product of FIG. 2 denotes a pre-established usable life of the semiconductor integrated circuit 1. The thickness of a gate oxide film is so set that, even if the drive capability of the transistor deteriorates due to voltage application thereto, the transistor can keep the drive capability of a pre-established level or more until the use hours reaches the product life.

In the example of FIG. 2 example, the transistors constituting the driving circuits DRV show the highest rate of deterioration in terms of drive capability. In an exemplary case where the gate oxide film of the gate transistor TTr has the thickness same as those of the transistors constituting the driving circuits DRV, the drive capability of the gate transistor TTr shows almost no deterioration even after the lapse of use hours. In another exemplary case where the gate oxide film of the gate transistor TTr has the thickness thinner than the transistors constituting the driving circuits DRV, on the other hand, the drive capability of the gate transistor TTr shows some deterioration with the lapse of use hours, but the rate of deterioration is lower compared with the transistors constituting the driving circuits DRV.

In the semiconductor integrated circuit 1 of this embodiment, because the memory cells connected to a pair of bit lines are quite large in number, the step-up voltage VPP is applied to the gate transistor TTr with a level of a frequency that can be referred to as incidental. That is, the duration of application of the step-up voltage VPP to the gate transistor TTr is extremely shorter than that to the transistors constituting the driving circuits DRV. Even if the thickness of the gate oxide film of the gate transistor TTr is reduced to a level of not being able to protect the product life from deterioration of the drive capability caused by continuous application of the step-up voltage VPP, if the step-up voltage VPP is applied to the gate transistor TTr with the frequency that can be referred to as incidental, the rate of deterioration for the gate transistor TTr in terms of drive capability can be reduced to a level not affecting the product life. Inconsideration thereof, in this embodiment, the gate oxide film thickness of the gate transistor TTr is set to be thinner within the limit in which any possible deterioration of the drive capability is sufficiently acceptable in view of the product life.

In this embodiment, the thickness of the gate oxide film of the gate transistor TTr is so set as to be thinner than those of the transistors constituting the driving circuits DRV but thicker than that of the transistor constituting the control circuit 12. Alternatively, as long as the rate of deterioration in terms of drive capability is in the extent acceptable in view of the product life, the gate oxide film of the gate transistor TTr may have the same thickness as that of the transistor constituting the control circuit 12.

As described in the foregoing, the semiconductor integrated circuit 1 of the embodiment includes the gate transistor TTr having the gate oxide film thinner than those of the transistors constituting the driving circuits. Such a thin gate oxide film provides a MOS transistor with the high current drive capability even with a small element size. That is, the semiconductor integrated circuit 1 of this embodiment can form the gate transistor TTr having the sufficient level of current drive capability even with a small element size. This favorably reduces the circuit size of the memory cells in the semiconductor integrated circuit 1. In the DRAM, because the memory cells occupy most of the circuit area, reducing the circuit size of the memory cells can reduce the circuit area in the DRAM to a considerable degree.

In this embodiment, the gate oxide film thickness of the gate transistor TTr is set thinner while taking the product life and element deterioration into consideration. Accordingly, reducing the thickness of the gate oxide film does not affect the product life or the product capability.

Second Embodiment

Figure 3:
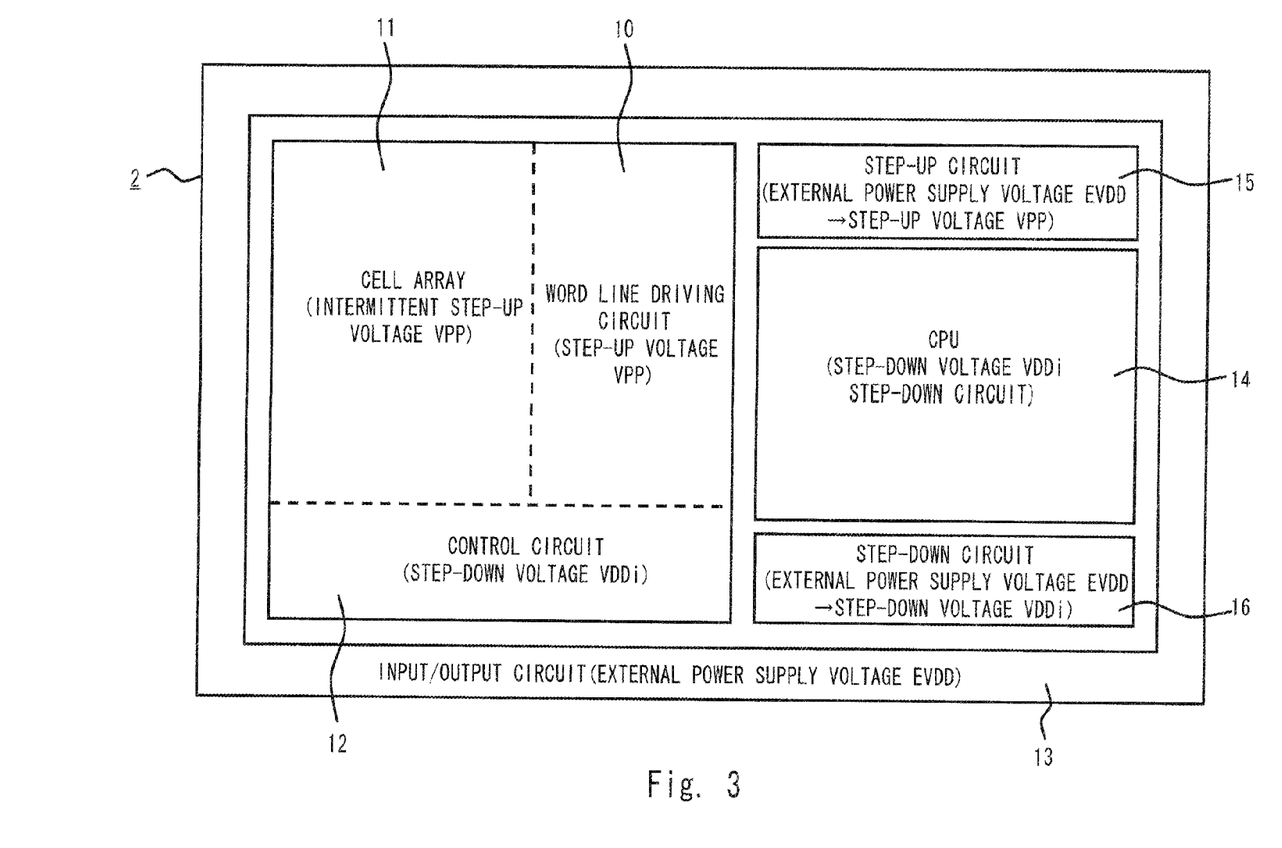
FIG. 3 is a block diagram showing a semiconductor integrated circuit according to a second embodiment of the present invention.

FIG. 3 shows a block diagram of a semiconductor integrated circuit 2 of a second embodiment. The semiconductor integrated circuit 2 is a microcomputer including therein the DRAM of the first embodiment. As shown in FIG. 3, the semiconductor integrated circuit 2 is configured to include the DRAM including the word-line driving circuit 10, the cell array 11, and the control circuit 12, an input/output circuit 13, a CPU (Central Processing Unit) 14, a step-up circuit 15, and a step-down circuit 16.

In this embodiment, the control circuit 12 of the DRAM operates with a step-down voltage VDDi, e.g., 1.0V, as the power supply voltage. This step-down voltage VDDi is generated by the step-down circuit 16. The word-line driving circuit 10 of the DRAM uses a step-up voltage VPP, e.g., 2.5V, as a first voltage, and a ground voltage VSS as a second voltage. The step-up voltage VPP is generated by the step-up circuit 15.

The input/output circuit 13 is an interface circuit between the semiconductor integrated circuit 2 and any other external device. In this embodiment, the maximum voltage to be applied to the input/output circuit 13 is presumably an external power supply voltage EVDD, e.g., 1.8V. The CPU 14 is an information processing circuit in charge of image processing and various types of control, for example. The CPU 14 operates with the step-down voltage VDDi generated by the step-down circuit 16 as the power supply voltage. The step-up circuit 15 generates the step-up voltage VPP by boosting the external power supply voltage EVDD. The step-down circuit 16 generates the step-down voltage VDDi by reducing the external power supply voltage EVDD.

Figure 4:
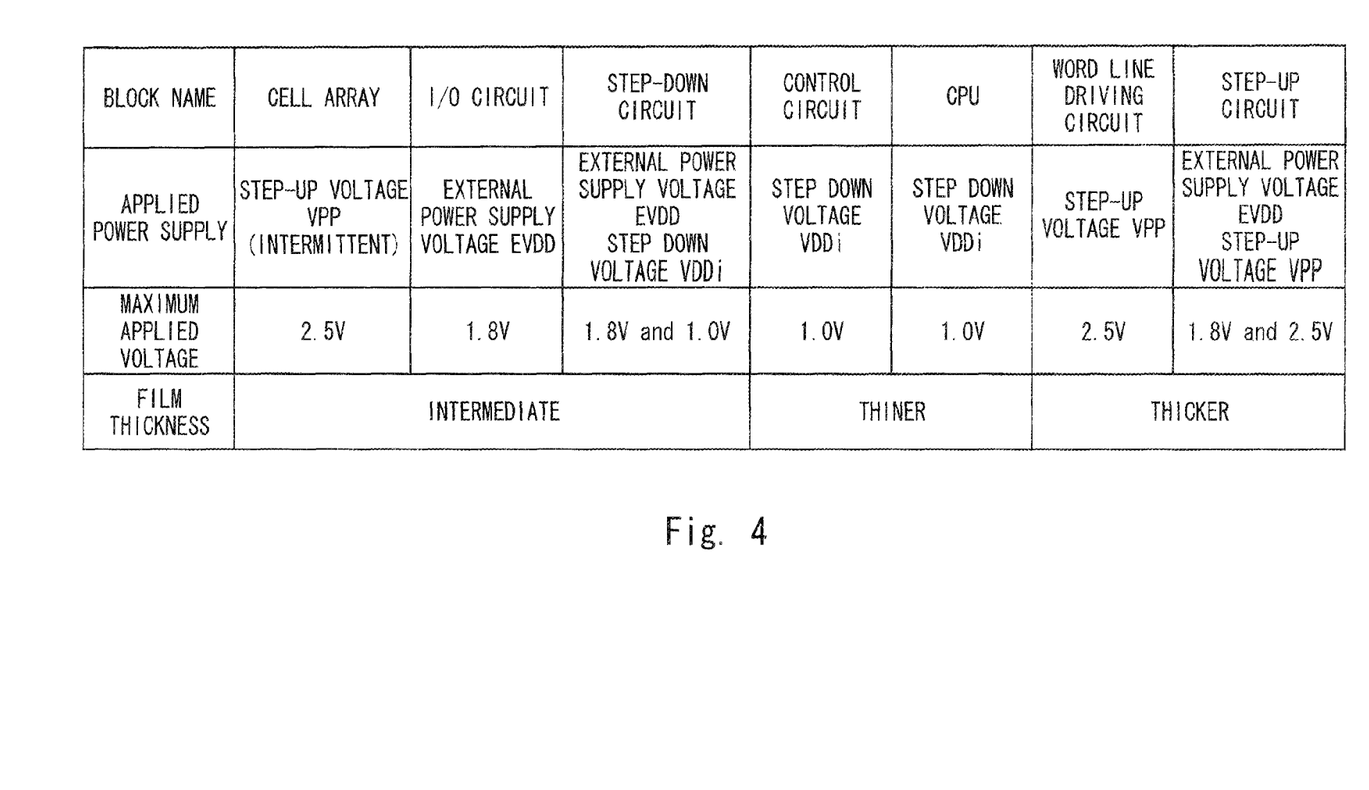
FIG. 4 is a table showing an exemplary thickness setting for a gate oxide film of a semiconductor integrated circuit according to the second embodiment of the present invention.

As such, the semiconductor integrated circuit 2 includes circuits operating with various levels of power supply voltage. The transistors used in circuits embedded in the semiconductor integrated circuit 2 thus have their own appropriate thicknesses for gate oxide films in accordance with the maximum value of an applied voltage. FIG. 4 shows an exemplary thickness setting for a gate oxide film. As shown in FIG. 4, in this embodiment, the transistors constituting the semiconductor integrated circuit 2 vary in thickness, i.e., three levels of thickness, in accordance with the maximum value of an applied voltage. For example, the transistor to which the step-up voltage VPP is applied is provided with a thick gate oxide film, and the transistor to which the step-down voltage VDDi is applied is provided with a thin gate oxide film. The transistor to which the external power supply voltage EVDD and the transistor to which the step-up voltage VPP is applied intermittently are each provided with a gate oxide film with an intermediate thickness. Herein, the intermediate thickness denotes the thickness considered as being between thick and thin.

First of all, in the circuits not including the DRAM, the maximum voltage for application to the input/output circuit 13 and the step-down circuit 16 is the external power supply voltage EVDD, and thus these circuits are each composed of the transistor having a gate oxide film of an intermediate thickness. The maximum voltage for application to the CPU 14 is the step-down voltage VDDi, and the CPU 14 is thus composed of the transistor having a thin gate oxide film. The maximum voltage for application to the step-up circuit 15 is the step-up voltage VPP, and the step-up circuit 15 is thus composed of the transistor having a thick gate oxide film. On the other hand, in the DRAM, because the maximum voltage for application to the word-line driving circuit 10 is the step-up voltage VPP, the word-line driving circuit 10 is composed of the transistor having a thick gate oxide film. The maximum voltage for application to the cell array 11 is the step-up voltage VPP, but this application of the step-up voltage VPP is performed in an intermittent manner. Accordingly, the cell array 11 is composed of the transistor having a gate oxide film of an intermediate thickness. The maximum voltage for application to the control circuit 12 is the step-down voltage DVVi, and the control circuit 12 is thus composed of the transistor having a thin gate oxide film.

As described in the foregoing, in the semiconductor integrated circuit including therein a DRAM, the gate oxide films of the transistors constituting the circuits not including the DRAM may vary in thickness, i.e., three or more levels of thickness. The gate oxide films of the transistors constituting the DRAM generally have two different thickness variations, one is for high-level voltage resistance, and the other is for low-level voltage resistance. Therefore, in a semiconductor integrated circuit including only a DRAM, for using a transistor including a gate oxide film of an intermediate thickness, there needs to additionally include a manufacturing process therefor. However, by providing the DRAM of the first embodiment to a semiconductor integrated circuit using the gate oxide films varying in thickness as such, i.e., three or more levels of thickness, this DRAM can be implemented with no need for additional manufacturing process.

The logical circuit such as the CPU 14 may use transistors having various threshold voltages depending on the thickness of the gate oxide film. For example, for a higher threshold voltage, the gate oxide film is increased in thickness, and for a lower threshold voltage, the gate oxide film is reduced in thickness. As such, in a semiconductor integrated circuit including therein various different types of circuits, even if voltages to be applied to these circuits are of the same value, the transistors may vary in thickness of a gate oxide film. That is, irrespective of the maximum value of an applied voltage, for setting the threshold voltage, the gate transistor TTr can be formed using a transistor having a thick gate oxide film.

Third Embodiment

Figure 5:
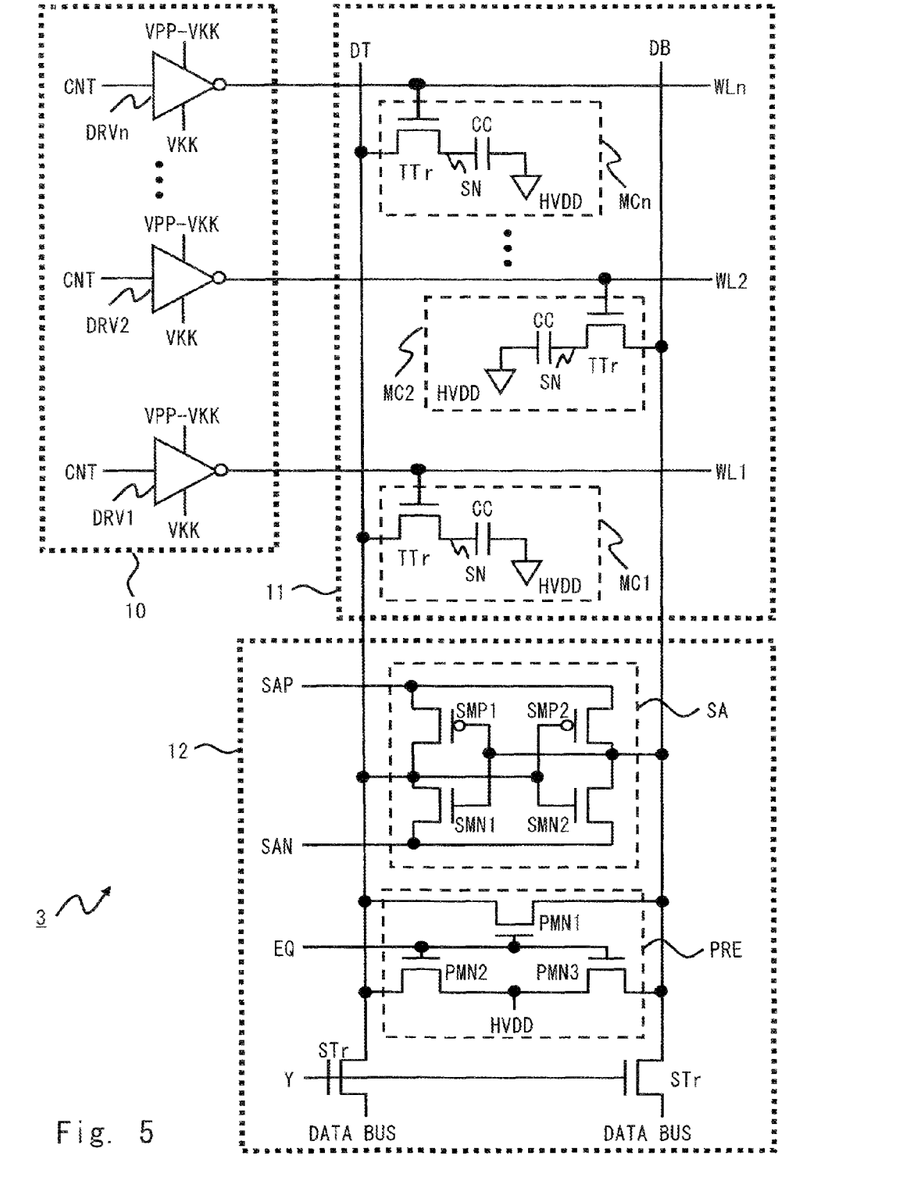
FIG. 5 is a block diagram showing a semiconductor integrated circuit according to a third embodiment of the present invention.

FIG. 5 shows a block diagram of a semiconductor integrated circuit 3 of a third embodiment. As shown in FIG. 5, in the semiconductor integrated circuit 3 of the third embodiment, the first and second voltages are changed for supply to the driving circuits DRV of the semiconductor integrated circuit 1 of the first embodiment. In the third embodiment, the second voltage is lower than the ground voltage VSS (hereinafter, referred to as negative voltage VKK), and the first voltage has a value calculated by subtracting the value of the negative voltage VKK from the step-up voltage VPP (hereinafter, referred to as step-up voltage VPP-VKK).

Figure 6:
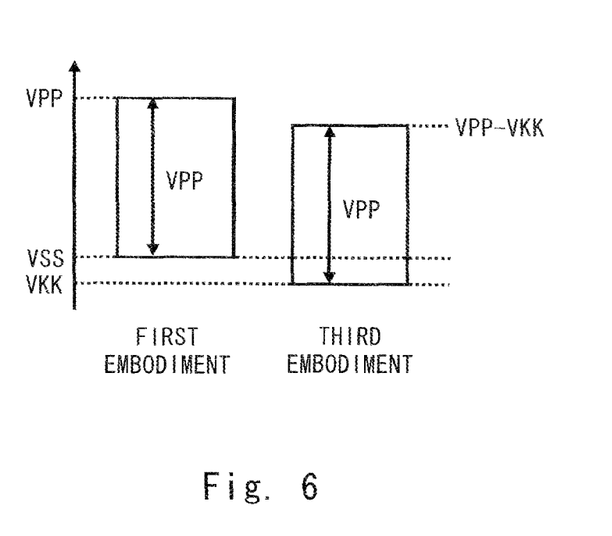
FIG. 6 is a graph showing a relationship between the voltage to be applied to the driving circuits DRV in the first embodiment and the voltage to be applied to the driving circuits DRV in the third embodiment.

FIG. 6 shows the relationship between the voltage to be applied to the driving circuits DRV in the first embodiment and the voltage to be applied to the driving circuits DRV in the third embodiment. As shown in FIG. 6, the voltage difference between the high-voltage-side and low-voltage-side voltages for application to the driving circuits DRV is the same, in the first and third embodiments. On the other hand, when the ground voltage VSS is used as a reference, the maximum voltage in the first embodiment is the step-up voltage VPP, and the maximum voltage in the third embodiment is the step-up voltage VPP-VKK. That is, in the third embodiment, the maximum voltage for application to the gate transistor TTr is smaller than that in the first embodiment. In this sense, in the third embodiment, the gate oxide film can be thinner in the gate transistor TTr compared with the first embodiment, e.g., the gate oxide film for use can have the thickness same as that of the transistor constituting the control circuit 12.

As described in the foregoing, in the third embodiment, the maximum voltage for application to the gate transistor TTr is lower than that in the first embodiment so that the gate oxide film of the gate transistor TTr can have the thickness same as that of the transistor constituting the control circuit 12. This thus enables, in the third embodiment, to from the transistors with the gate oxide films having two different types of thickness. With the less thickness variations of the gate oxide film as such, the manufacturing process can be simplified than in the first embodiment.

With a thinner gate oxide film of the gate transistor TTr, the threshold voltage Vt of the transistor tends to be reduced. In the third embodiment, however, because the negative voltage VKK is used when the gate transistor TTr is not being selected, even if the threshold voltage Vt thereof is low, a leak current in the not-selected state can be reduced. With the leak current being reduced as such for the gate transistor TTr in the not-selected state, the discharge speed of the electric charge accumulated in the capacitor CC can be slowed, thereby enabling to reduce the frequency of the refresh operation with respect to the capacitor CC. With the frequency of the refresh operation being reduced as such, the frequency of the gate transistor being in the selected state is reduced, whereby the stress to the gate oxide film can be reduced to a further degree in the third embodiment compared in the first embodiment.

Fourth Embodiment

Figure 7:
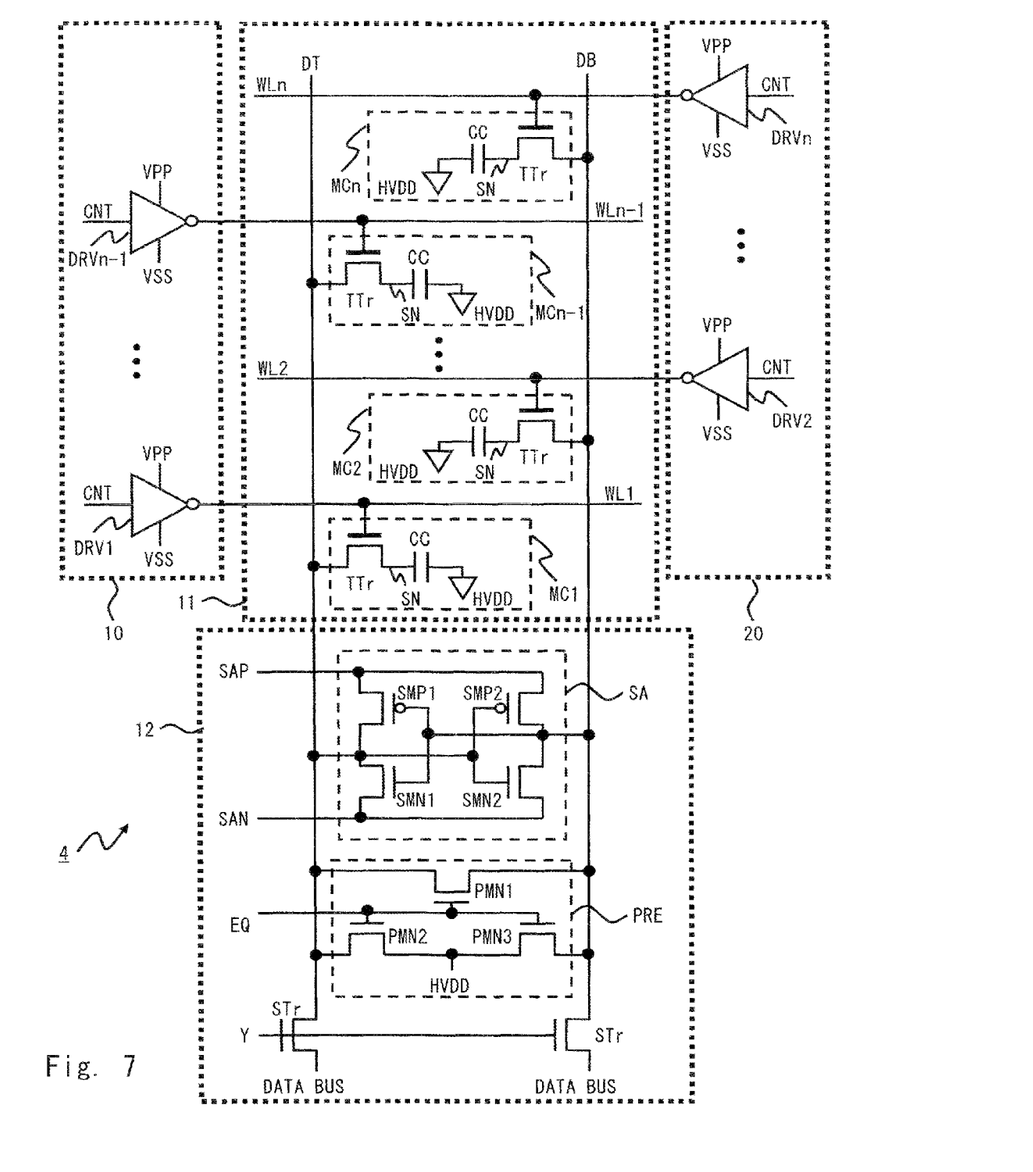
FIG. 7 is a block diagram showing a semiconductor integrated circuit of the related art.

FIG. 7 shows a block diagram of a semiconductor integrated circuit 4 of a fourth embodiment. As shown in FIG. 7, compared with the semiconductor integrated circuit 1 of the first embodiment, the difference of the semiconductor integrated circuit 4 of the fourth embodiment lies in the placement position of the word-line driving circuit 10. The semiconductor integrated circuit 4 includes the word-line driving circuit 10 and another word-line driving circuit 20 on both sides of the cell array 11. The word-line driving circuit 20 is provided therein with the driving circuits DRV for driving the memory cells MC located at even-numbered positions in the word-line driving circuit 10. On the other hand, the word-line driving circuit 10 in the fourth embodiment is provided therein with the driving circuits DRV for driving the remaining odd-numbered memory cells MC.

In the first embodiment, described is the case where the gate transistor TTr has a gate oxide film thinner than those of the transistors constituting the driving circuits, and the element size is also small. As such, by reducing the element size of the gate transistor TTr, the circuit area of the cell array 11 can be reduced. On the other hand, the transistor constituting the word-line driving circuit 10 has a thick gate oxide film and a large element size. In this case, when all of the driving circuits DRV are disposed inside of the word-line driving circuit 10, the word-line driving circuit 10 is increased in size, thereby failing to provide the sufficient space between the word-lines WL.

In consideration thereof, in the fourth embodiment, the word-line driving circuits 10 and 20 are so disposed as to sandwich the cell array 11. The word-line driving circuit 10 is provided therein with the driving circuits DRV for driving the odd-numbered memory cells MC, and the word-line driving circuit 20 is provided therein with the driving circuits DRV for driving the even-numbered memory cells MC. With such a placement of the driving circuits DRV, the number of the driving circuits to be provided in each of the word-line driving circuits can be favorably reduced, thereby being able to reduce the size of each of the word-line driving circuit. This accordingly enables to reduce the space between the word lines WL.

As described in the foregoing, in the fourth embodiment, by placing the word-line driving circuits 10 and 20 as sandwiching the cell array 11, the space can be reduced between the word lines WL. That is, the fourth embodiment can increase the efficiency in the circuit area compared with the first embodiment.

In the embodiments described above, for example, an NMOS transistor is used as an example of the gate transistor TTr, but a PMOS transistor will surely be used for the same effect. When the gate transistor TTr is a PMOS transistor, the gate voltage in the selected state is the ground voltage VSS (or negative voltage VKK), and the gate voltage in the not-selected state is the step-up voltage VPP (or the power supply voltage VDD). As such, in the not-selected state that is longer with respect to the operating time, the high voltage is applied to the gate of the gate transistor TTr. However, with a PMOS transistor, the well voltage is the step-up voltage VPP (or the power supply voltage VDD). Therefore, the voltage difference between the gate and well in the not-selected state will be almost 0V as is the case of using an NMOS transistor. That is, even in a case where the gate transistor TTr is a PMOS transistor, the transistor TTr does not remain long in the selected-state in which the voltage difference between the gate and well is large. In view thereof, when the gate transistor TTr is a PMOS transistor, the gate oxide film of the gate transistor TTr can be made thinner than that of the transistors constituting the driving circuits DRV.

The first to fourth exemplary embodiments can be combined as desirable by one of ordinary skill in the art.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A semiconductor integrated circuit, comprising:
   a memory cell that includes a gate transistor;
   a word line that is connected to a gate of the gate transistor;
   a bit line that is connected to the memory cell; and
   a driving circuit that drives the word line, and includes a transistor that has a gate oxide film thicker than a gate oxide film of the gate transistor,
   wherein a range of voltage between the gate and back-gate of the gate transistor is larger than a voltage range of the bit line.

2. The semiconductor integrated circuit according to claim 1, wherein a voltage difference between the gate and back-gate of the gate transistor in read mode is larger than the voltage range of the bit line.

3. The semiconductor integrated circuit according to claim 1, further comprises:
   a control circuit that controls writing data to the memory cell or reading data from the memory cell,
   wherein the range of voltage between the gate and back-gate of the gate transistor is larger than a range of voltage between a power supply voltage and a ground voltage supplied to the control circuit.

4. The semiconductor integrated circuit according to claim 3, wherein a gate oxide film of a transistor constituting the control circuit is thinner than the gate oxide film of the gate transistor.

5. The semiconductor integrated circuit according to claim 3, wherein the driving circuit drives the word line with either a first voltage or a second voltage in accordance with a control signal, a voltage difference between the first and second voltages is larger than a voltage difference between the power supply voltage and the ground voltage supplied to the control circuit.

6. The semiconductor integrated circuit according to claim 5, wherein either of the first and second voltages being higher is higher than the power supply voltage of the control circuit.

7. The semiconductor integrated circuit according to claim 5, wherein either of the first and second voltages being lower is lower than the ground voltage of the control circuit.

8. The semiconductor integrated circuit according to claim 3, wherein the gate oxide film of the gate transistor has substantially the same thickness as a gate oxide film of a transistor constituting the control circuit.

9. The semiconductor integrated circuit according to claim 8, wherein the voltage range of the bit line has substantially the same as the range of voltage between a power supply voltage and a ground voltage supplied to the control circuit.

* * * * *